United States Patent
Peng

(10) Patent No.: US 8,120,026 B2
(45) Date of Patent: Feb. 21, 2012

(54) TESTING WIRING STRUCTURE AND METHOD FOR FORMING THE SAME

(75) Inventor: Zhilong Peng, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 230 days.

(21) Appl. No.: 12/437,246

(22) Filed: May 7, 2009

(65) Prior Publication Data

US 2009/0278123 A1    Nov. 12, 2009

(30) Foreign Application Priority Data

May 12, 2008  (CN) .......................... 2008 1 0106341

(51) Int. Cl.
*H01L 23/58* (2006.01)

(52) U.S. Cl. ................ 257/48; 438/11; 438/14; 438/18; 257/E23.002

(58) Field of Classification Search ...................... 257/48
See application file for complete search history.

(56) References Cited

U.S. PATENT DOCUMENTS

| | | | | |
|---|---|---|---|---|
| 6,621,536 | B1 * | 9/2003 | Taguchi | 349/40 |
| 6,750,926 | B2 * | 6/2004 | Ohgiichi et al. | 349/40 |
| 2006/0103412 | A1 | 5/2006 | Kimura et al. | |
| 2006/0284633 | A1 | 12/2006 | Park | |
| 2007/0177053 | A1 | 8/2007 | Lin et al. | |
| 2007/0234151 | A1 | 10/2007 | Hsu et al. | |

FOREIGN PATENT DOCUMENTS

| | | |
|---|---|---|
| CN | 1773357 A | 5/2006 |
| JP | 05-341246 A | 12/1993 |
| JP | 11-316388 A | 11/1999 |
| JP | 2003-114447 A | 4/2003 |
| JP | 2006-276368 A | 10/2006 |

\* cited by examiner

*Primary Examiner* — Ajay K Arora
(74) *Attorney, Agent, or Firm* — Ladas & Parry LLP

(57) ABSTRACT

The invention provides a testing wiring structure of a thin film transistor (TFT) motherboard for applying signals to a plurality of signal lines in a pixel region on the motherboard and a method for forming the same. The testing wiring structure comprises a gate layer metallic testing wiring and a drain layer metallic testing wiring that is over and intersects the gate layer metallic testing wiring. The gate layer metallic testing wiring are connected to a portion of the plurality of signal lines and the drain layer metallic testing wiring both are connected to remaining portion of the plurality of signal lines. A pixel electrode layer testing wiring is further provided over the drain layer metallic testing wiring in an intersecting region where the drain layer metallic testing wiring intersects the gate layer metallic testing wiring. The pixel electrode layer testing wiring is electrically connected to the drain layer metallic testing wiring to be a redundant testing wiring of the drain layer metallic testing wiring.

4 Claims, 3 Drawing Sheets

TESTING WIRING STRUCTURE AND METHOD FOR FORMING THE SAME

BACKGROUND

The invention relates to a thin film transistor-liquid crystal display (TFT-LCD) device, and more particularly, to a testing wiring structure of a TFT array motherboard and a method for forming the same.

In recent years, TFT-LCD devices, which are of small volume, light weight, low power consumption and free of radiation, have gradually prevailed in the market of flat panel display devices. In general, a TFT-LCD device comprises a thin film transistor (TFT) array substrate and a color filter substrate that are maintained in parallel with a gap therebetween. Sandwiched between the TFT array substrate and the color filter substrate is a liquid crystal layer that varies its optical characteristics in response to the electrical field applied thereon. A TFT-LCD device can have an array including up to millions of pixels, and each pixel is controlled with a TFT as a switching device so as to display mages.

FIG. 1 is a schematic layout view of a conventional testing wiring structure of a TFT array motherboard. As shown in FIG. 1, a motherboard 100 comprises a plurality of panels 11, for example, four panels 11. After manufacturing and testing, the motherboard 100 is separated to be individual panels for assemble. On one side of a pixel region where the panels are formed, there are disposed testing wirings 2 for respective pixel regions. Each pixel region is provided with two testing wirings, which are connected to odd gate lines and even gate lines, respectively. During the testing of TFT pixel regions on the TFT array motherboard, a testing tool applies gate scan signals to respective panels through pin-contacting pads 10 and testing wirings 2, and similarly, the testing tool applies data scan signals to the panels of the motherboard 100 through another set of pin-contacting pads 10 and testing wirings 2. In order to reduce the testing time, pin-contacting pads 10 for two or more panels are located in a same region, and thus the testing tool can test two or more panels each time. The testing efficiency can be improved. Testing signals are transmitted to panels through testing wirings 2 in connection with the pin-contacting pads 10, realizing the testing on the panels in the TFT array motherboard. For the purpose of testing two or more panels with one set of pin-contacting pads 10 and maximizing the utilization efficiency of the motherboard, the space between panels is set to be very small, resulting in difficulties in routing the testing wirings. As shown with the dashed circular region in FIG. 1, the testing wirings generally give rise to an intersecting structure.

FIG. 2 is a schematic enlarged view of the dashed circular region in FIG. 1, showing the intersecting structure of the testing wirings. With reference to FIG. 2, a gate layer metallic testing wiring 3 intersects a drain layer metallic testing wiring 4, with the testing wiring 4 being formed above the testing wiring 3. The gate layer metallic testing wiring 3 is on the same layer as the gate electrodes of the TFTs, and the drain layer metallic testing wiring 4 is on the same layer as the drain and source electrodes of the TFTs. Both the testing wiring 3 and 4 are formed through a patterning process. Due to problems originating from the process, the intersecting region as shown in FIG. 2 may be broken down by electrostatic discharge (ESD), thus adversely affecting the testing on the panels. FIG. 3 is a schematic enlarged view of the dashed circular region in FIG. 1, showing another intersecting structure of the testing wirings. Also, a gate layer metallic testing wiring 3 intersects a pixel electrode layer testing wiring 5 with the latter being formed above the former. The gate layer metallic testing wiring 3 is on the same layer as the gate electrodes of the TFTs, and the pixel electrode layer testing wiring 5 is on the same layer as the pixel electrodes of the pixels. Compared with the drain layer metallic testing wiring 4, the pixel electrode layer testing wiring 5 is positioned above a passivation layer that is formed on the source and drain electrodes, and thus it is less likely to incur an electrostatic breakdown. Via holes 6 are formed in both ends of the pixel electrode layer testing wiring 5 such that the pixel electrode layer testing wiring 5 can be connected through the via holes 6 to the drain layer metallic testing wiring 4 in a non-intersecting region. Since the pixel electrode layer testing wiring 5 is far away from the gate layer metallic testing wiring 3, a resistance to the electrostatic breakdown is enhanced. However, even when the wiring structure shown in FIG. 3 is employed, there is a possibility of occurrence of electrostatic breakdown, and thus the electrical testing of the panels can not be performed successfully, undesirably affecting the manufacture of the TFT-LCD device.

SUMMARY OF THE INVENTION

The embodiment of the invention is to provide testing wiring on a TFT array motherboard and a method for forming the same. An intersecting region where the testing wirings intersect with each other is less likely to invoke an electrostatic breakdown, and even if an electrostatic breakdown occurs in the intersecting region, a normal testing operation may be ensured after a simple treatment.

According to an embodiment of the invention, a testing wiring structure on a TFT array motherboard for applying signals to a plurality of signal lines in a pixel region on the motherboard comprises a gate layer metallic testing wiring and a drain layer metallic testing wiring that is over and intersects the gate layer metallic testing wiring. The gate layer metallic testing wiring is connected to a portion of the plurality of signal lines and the drain layer metallic testing wiring is connected to remaining portion of the plurality of signal lines. A pixel electrode layer testing wiring is further provided over the drain layer metallic testing wiring in an intersecting region where the drain layer metallic testing wiring intersects the gate layer metallic testing wiring, and the pixel electrode layer testing wiring is electrically connected to the drain layer metallic testing wiring to be a redundant testing wiring of the drain layer metallic testing wiring.

According to another embodiment of the invention, there is provided a method for forming a testing wiring structure of a thin film transistor (TFT) array motherboard, comprising:

step 1 of depositing a gate metallic layer on a base substrate and patterning the gate metallic layer so as to form gate lines in a pixel region and a gate layer metallic testing wiring in a testing wiring region, the gate layer metallic testing wiring being connected with a portion of the gate lines;

step 2 of depositing an insulating layer on the base substrate after step 1;

step 3 of forming an active layer in the pixel region on the base substrate after step 2, wherein the active layer is etched away so as not to be left in the testing wiring region;

step 4 of depositing a source/drain metallic layer on the base substrate after step 3 and patterning the source/drain metallic layer so as to form a drain layer metallic testing wiring, the drain layer metallic testing wiring being connected with remaining portion of the gate lines and intersecting the gate layer metallic testing wiring;

step 5 of depositing a passivation layer on the base substrate after step 4 and patterning the passivation layer so as to form via holes for connection in the passivation layer;

step 6 of depositing a pixel electrode layer on the base substrate after step 5 and patterning the pixel electrode layer so as to form a pixel electrode in the pixel region and to form a pixel electrode layer testing wiring intersecting the gate layer metallic testing wiring, both ends of the pixel electrode layer metallic testing wiring being connected through the via holes in the passivation layer to the drain layer metal in the drain layer metallic testing wiring.

According to another embodiment of the invention, there is provided a method for forming a testing wiring structure of a thin film transistor (TFT) array motherboard, comprising:

step 1 of depositing a gate metallic layer on a base substrate and patterning the gate metallic layer so as to form gate lines in a pixel region and a gate layer metallic testing wiring in a testing wiring region;

step 2 of depositing an insulating layer on the base substrate after step 1;

step 3 of forming an active layer in the pixel region on the base substrate after step 2, wherein the active layer is etched away so as not to be left in the testing wiring region;

step 4 of depositing a source/drain metallic layer on the base substrate after step 3 and patterning the source/drain metallic layer so as to form data lines and a drain layer metallic testing wiring, wherein the drain layer metallic testing wiring is connected with a portion of the data lines and intersecting the gate layer metallic testing wiring, and remaining portion of the data lines are connected to the gate layer metallic testing wiring;

step 5 of depositing a passivation layer on the base substrate after step 4 and patterning the passivation layer so as to form via holes in the passivation layer for connection;

step 6 of depositing a pixel electrode layer on the base substrate after step 5 and patterning the pixel electrode layer so as to form a pixel electrode in the pixel region and to form a pixel electrode layer testing wiring intersecting the gate layer metallic testing wiring, both ends of the pixel electrode layer metallic testing wiring being connected through the via holes in the passivation layer to the drain layer metal in the drain layer metallic testing wiring.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The invention will become more fully understood from the detailed description given hereinafter and the accompanying drawings which are given by way of illustration only, and thus are not limitative of the invention and wherein.

DETAILED DESCRIPTION OF THE EMBODIMENTS

The invention is described hereinafter with reference to the accompanying drawings, in which the embodiments of the invention are shown.

Figure 1:
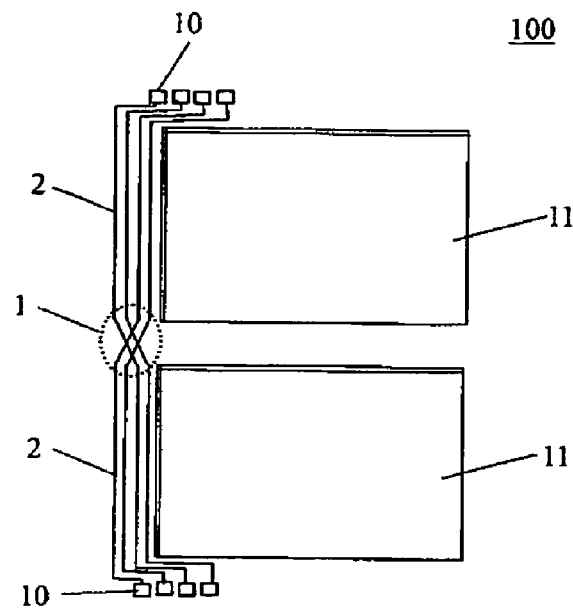
FIG. 1 is a schematic layout view of a conventional testing wiring structure on a TFT array motherboard.
Figure 2:
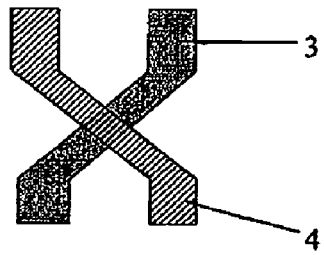
FIG. 2 is a schematic enlarged view of the dashed circular region in FIG. 1, showing a intersecting structure of the testing wirings.
Figure 3:
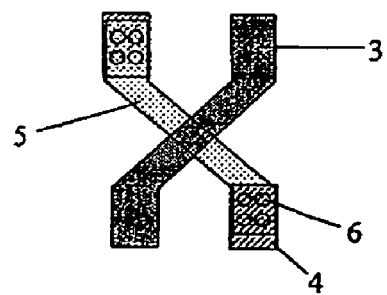
FIG. 3 is a schematic enlarged view of the dashed circular region in FIG. 1, showing another intersecting structure of the testing wirings.
Figure 4:
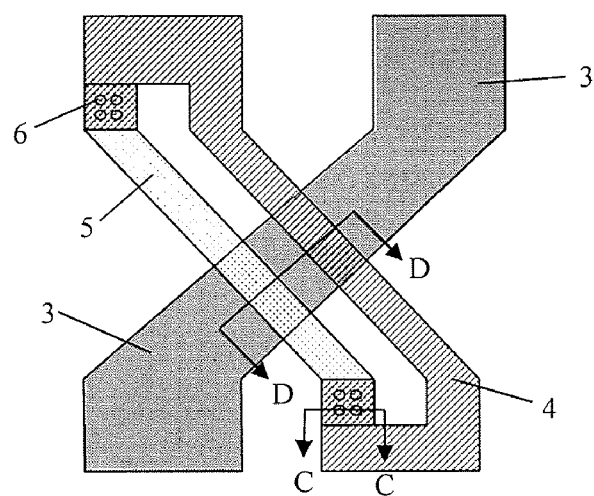
FIG. 4 is a schematic enlarged view showing a layout of the a testing wiring structure on a TFT array motherboard according to an exemplary embodiment of the invention.
Figure 5:
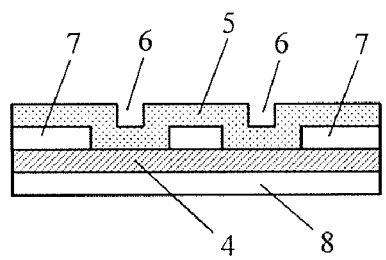
FIG. 5 is a cross section view taken along a line C-C in FIG. 4.
Figure 6:
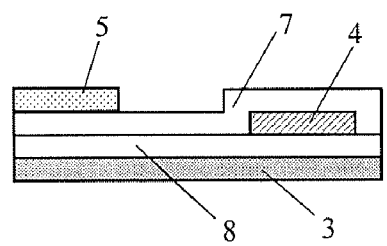
FIG. 6 is a cross section view taken along a line D-D in FIG. 4.

FIG. 4 is a schematic enlarged view showing a layout of a testing wiring structure on a TFT array motherboard according to an exemplary embodiment of the invention; FIG. 5 is a cross section view taken along a line C-C in FIG. 4; and FIGS. 6 is a cross section view taken along a line D-D in FIG. 4. The layout of the testing wiring structure according to the embodiment is described in detail with reference to FIGS. 4, 5 and 6.

As shown in FIGS. 4, 5 and 6, a testing wiring structure for applying gate scan signals to gate lines of the panels on a TFT array motherboard 100 according to the embodiment comprises a gate layer metallic testing wiring 3, a drain layer metallic testing wiring 4, and a pixel electrode layer testing wiring 5. The gate layer metallic testing wiring 3 is on the same layer as the gate electrodes of the TFTs on the motherboard 100 and for example is connected to the odd gate lines in the pixel region where the panels are formed; the drain layer metallic testing wiring 4 is on the same layer as the drain and source electrodes of the TFTs and for example is connected to the remaining even gate lines in the pixel region where the panels are formed; and the pixel electrode layer testing wiring 5 is on the same layer as the pixel electrodes of the pixels on the motherboard 100. A gate insulating layer 8 is formed beneath the drain layer metallic testing wiring 4, and a passivation layer 7 is formed beneath the pixel electrode layer testing wiring 5. Both the drain layer metallic testing wiring 4 and the pixel electrode layer testing wiring 5 intersect the gate layer metallic testing wiring 3. The gate layer metallic testing wiring 3 is integrally formed with the other gate layer metal portion in the testing wiring structure, the drain layer metallic testing wiring 4 is integrally formed with the other drain layer metal portion in the testing wiring structure, and the pixel electrode layer testing wiring 5 is formed only in the intersecting region as shown in FIG. 4. The pixel electrode layer testing wiring 5 overlaps the drain layer metal portion of the drain layer metallic testing wiring 4 on the ends of the wiring 5, where via holes 6 are provided. As shown in FIG. 5, the pixel electrode layer testing wiring 5 is connected through the via holes 6 to the drain layer metal portion of the drain layer metallic testing wiring 4. Thus, in the region where the gate layer metallic testing wiring 3 intersects the drain layer metallic testing wiring 4, the pixel electrode layer testing wiring 5 acts as a redundant testing wiring for the drain layer metallic testing wiring 4. As shown in FIG. 6, the pixel electrode layer testing wiring 5 is spaced apart from the drain layer metallic testing wiring 4 along a longitudinal direction. The pixel electrode layer testing wiring 5 may be parallel or not parallel to the drain layer metallic testing wiring 4. With reference to FIGS. 5 and 6, between the gate layer metallic testing wiring 3 and the drain layer metallic testing wiring 4 is formed the gate insulating layer 8 only; however, in addition to the gate insulating layer 8, the passivation layer 7 is further disposed between the gate layer metallic testing wiring 3 and the pixel electrode layer testing wiring 5. Therefore, the resistance to the electrostatic breakdown is enhanced in the structure of the embodiment. The electrostatic breakdown is most likely to occur in the intersecting region between the gate layer metallic testing wiring 3 and the drain layer metallic testing wiring 4. In the embodiment, even when an electrostatic breakdown occurs, the gate layer metallic testing wiring 3 is shorted to the drain layer metallic testing wiring 4 only, which protects the intersecting structure between the gate layer metallic testing wiring 3 and the pixel electrode layer testing wiring 5. Consequently, in case of electrostatic breakdown, the testing structure can work appropriately to perform the desired test as a whole. At this time, a cutting treatment with laser can be performed on the drain layer metallic testing wiring 4 to disconnect it from the gate layer metallic testing wiring 3 to remove the short, and then the test may be done with the redundant pixel electrode layer testing wiring 5. In the embodiment, in the intersecting region, the drain layer metallic testing wiring 4 and the pixel electrode layer testing wiring 5 are redundant with respect to each other.

In the above embodiment, the gate layer metallic testing wiring 3 can be connected to the even gate lines, while the drain layer metallic testing wiring 4 can be connected to the remaining odd gate lines. Alternatively, the gate lines can be divided into two groups in a way other than the odd and even gate lines, the gate layer metallic testing wiring 3 can be connected to one group of gate lines, while the drain layer metallic testing wiring 4 can be connected to the other group of gate lines.

Figure 7:
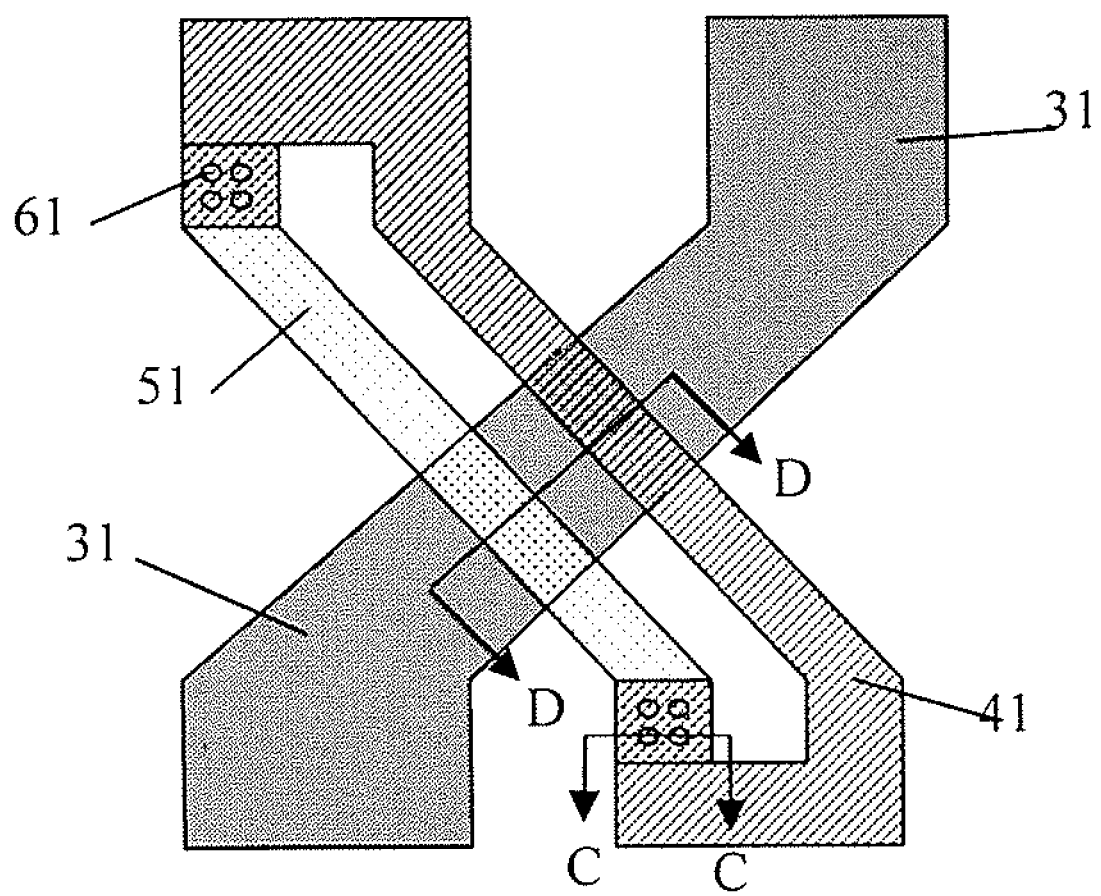
FIG. 7 is a schematic enlarged view showing a layout of the a testing wiring structure on a TFT array motherboard according to another exemplary embodiment of the invention.

As shown in FIG. 7, a testing wiring structure for applying data scan signals to the data lines of the panels on a TFT array motherboard 100 according to another embodiment comprises a gate layer metallic testing wiring 31, a drain layer metallic testing wiring 41, and a pixel electrode layer testing wiring 51. The gate layer metallic testing wiring 31 is on the same layer as the gate electrodes of the TFTs on the motherboard 100 and for example is connected to the odd date lines in the pixel region where the panels are formed for example through via holes and the like; the drain layer metallic testing wiring 41 is on the same layer as the drain and source electrodes of the TFTs and for example is connected to the remaining even data lines in the pixel region where the panels are formed; and the pixel electrode layer testing wiring 51 is on the same layer as the pixel electrodes of the pixels on the motherboard 100. Alternatively, the data lines can be divided into two groups in a way other than the odd and even data lines, the gate layer metallic testing wiring 31 can be connected to one group of data lines, while the drain layer metallic testing wiring 41 can be connected to the other group of data lines.

Next, a method for forming the testing wiring structure according to an exemplary embodiment of the invention is described below in detail.

The method for forming the testing wiring structure according to an exemplary embodiment of the invention comprises following steps:

Step 1 of depositing a gate metallic layer on a base substrate and patterning the gate metallic layer so as to form gate lines, gate electrodes of thin film transistors and common electrode signal lines in a pixel region and to form a gate layer metallic testing wiring 3 and also a gate layer metallic testing wiring 31 in a testing wiring region;

Step 2 of depositing an insulating layer on the base substrate after step 1, the insulating layer serving as a gate insulating layer 8 of the thin film transistors;

Step 3 of forming an amorphous silicon (a-Si) layer and a n+ amorphous silicon (n+ a-Si) layer in order in the pixel region on the base substrate after step 2, and patterning the a-Si layer and the n+ a-Si layer so as to form an active layer in the pixel region, wherein the active layer is etched away from the region where testing wirings are to be formed (that is, the testing wiring region) such that the testing wirings do not include any of the active layer;

Step 4 of depositing a source/drain metallic layer on the base substrate after step 3 and patterning the source/drain metallic layer so as to form a data line and drain electrode and source electrodes in the pixel region and to form a drain layer metallic testing wiring 4 and a drain layer metallic testing wiring 41 in the testing wiring region;

Step 5 of depositing a passivation layer on the base substrate after step 4 and patterning the passivation layer so as to form via holes in regions where metallic layers or other conductive layers are to be connected to a pixel electrode;

Step 6 of depositing a pixel electrode layer on the base substrate after step 5 and patterning the pixel electrode layer so as to form a pixel electrode in the pixel region and to form a pixel electrode layer testing wiring 5 intersecting the gate layer metallic testing wiring 3 and a pixel electrode layer testing wiring 51 intersecting the gate layer metallic testing wiring 31, the pixel electrode in the pixel region being connected to the drain electrode through a via hole, both ends of the pixel electrode layer testing wiring 5 being connected through via holes to the drain layer metal portion of the drain layer metallic testing wiring 4, and both ends of the pixel electrode layer testing wiring 51 being connected through via holes to the drain layer metal portion of the drain layer metallic testing wiring 41.

In the above steps, the patterning can be performed with any patterning process in the art. In step 1, the gate layer metallic testing wiring 3 may be integrally formed with the odd gate lines. The gate metallic layer is etched away from the region where a drain layer metallic testing wiring is to be formed later, such that the regions for testing wirings connected to the drain layer metallic testing wirings 4 and 41 do not comprise any of the gate metallic layer. In the embodiment, the common electrode signal line for forming a storage capacity with the pixel electrode may not be formed if desired.

In the step 3, materials for the active layer are not limited to those disclosed above and may be selected from the appropriate materials in the art, for example, polysilicon.

In the step 4, the drain layer metallic testing wiring 4 overlaps the even gate lines in the pixel region and is connected to the even gate lines through via holes, the drain layer metallic testing wiring 41 is connected to the even data lines, and the odd data lines are connected with the gate layer metallic testing wiring 31 for example through the via holes and the like.

In the step 5, the via holes are formed in regions where the pixel electrode layer testing wiring 5 and the pixel electrode layer testing wiring 51 are to be connected to the drain layer metal portions of the drain layer metallic testing wiring 4 and the drain layer metallic testing wiring 41, respectively.

According to an exemplary embodiment of the invention, steps 3 and 4 can be performed together by the patterning process that utilizes a gray tone mask (GTM) or a half tone mask (HTM) process to pattern. As shown in FIG. 5, in the intersecting region, the pixel electrode layer testing wiring 5 is spaced apart from the drain layer metallic testing wiring 4 in a longitudinal direction, and also the pixel electrode layer testing wiring 51 is spaced apart from the drain layer metallic testing wiring 41 in a longitudinal direction.

In the embodiment, the testing wiring structure and the thin film transistor pixel regions on the thin film transistor motherboard may be formed simultaneously. In the manufacturing, each motherboard is manufactured, and the panels and the testing wirings are formed simultaneously.

Electrostatic breakdown is likely to occur in the intersecting region between the drain layer metallic testing wiring and the gate layer metallic testing wiring. In the embodiment of the invention, however, since a redundant testing wiring, i.e., the pixel electrode layer testing wiring, is provided for the drain layer metallic testing wiring, even if the electrostatic breakdown occurs, by performing a cutting treatment with laser on the drain layer metallic testing wiring to remove short, the testing can still be performed with the pixel electrode layer testing wiring. Thus, the testing wiring structure according to the embodiment of the invention has an improved reliability, adverse affect on the electrical testing of the manufactured panels can be reduced, and the yield is improved.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A testing wiring structure of a thin film transistor (TFT) array motherboard for applying signals to a plurality of signal lines in a pixel region on the motherboard, comprising a gate layer metallic testing wiring and a drain layer metallic testing wiring that is over and intersects the gate layer metallic testing wiring, the gate layer metallic testing wiring being connected to a portion of the plurality of signal lines, and the drain layer metallic testing wiring being connected to remaining portion of the plurality of signal lines, wherein a pixel electrode layer testing wiring is further provided over the drain layer metallic testing wiring in an intersecting region where the drain layer metallic testing wiring intersects the gate layer metallic testing wiring, and the pixel electrode layer testing wiring is electrically connected to the drain layer metallic testing wiring to be a redundant testing wiring of the drain layer metallic testing wiring.

2. The testing wiring structure of a TFT array motherboard according to claim 1, wherein a passivation layer is formed between the pixel electrode layer testing wiring and the drain layer metallic testing wiring, and both ends of the pixel electrode layer testing wiring are connected through via holes formed in the passivation layer to the drain layer metal portion of the drain layer metallic testing layer.

3. The testing wiring structure of a TFT array motherboard according to claim 1, wherein the pixel electrode testing wiring and the drain layer metallic testing wiring each extend in a first direction, the gate layer metallic testing wiring extends in a second direction, and the pixel electrode layer testing wiring is laterally separated from the drain layer metallic testing wiring in the second direction in the intersecting region, the second direction being substantially perpendicular to the first direction.

4. The testing wiring structure of a TFT array motherboard according to claim 1, wherein the signal lines are gate lines or data lines in the pixel region.

* * * * *